(12) United States Patent
Choi et al.

(10) Patent No.: US 9,112,155 B2
(45) Date of Patent: Aug. 18, 2015

(54) ELECTRON DONATING POLYMER AND ORGANIC SOLAR CELL INCLUDING THE SAME

(75) Inventors: Yeong Suk Choi, Suwon-si (KR); Soo-Ghang Ihn, Hwaseong-si (KR); Bulliard Xavier, Suwon-si (KR); Sung Young Yun, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 738 days.

(21) Appl. No.: 13/166,427

(22) Filed: Jun. 22, 2011

(65) Prior Publication Data
US 2011/0315224 A1    Dec. 29, 2011

(30) Foreign Application Priority Data

Jun. 24, 2010 (KR) .......... 10-2010-0060234
Feb. 11, 2011 (KR) .......... 10-2011-0012502

(51) Int. Cl.
| | |
|---|---|
| C08G 75/00 | (2006.01) |
| H01L 51/00 | (2006.01) |
| C08G 61/12 | (2006.01) |
| H01L 51/42 | (2006.01) |

(52) U.S. Cl.
CPC .......... *H01L 51/0036* (2013.01); *C08G 61/126* (2013.01); *C08G 2261/3243* (2013.01); *C08G 2261/414* (2013.01); *C08G 2261/91* (2013.01); *H01L 51/0043* (2013.01); *H01L 51/42* (2013.01); *Y02E 10/549* (2013.01)

(58) Field of Classification Search
CPC .............. C08G 2261/3243; C08G 61/126; H01L 51/0036
USPC ................................... 528/377, 378, 380
See application file for complete search history.

(56) References Cited

U.S. PATENT DOCUMENTS

| | | | |
|---|---|---|---|
| 7,507,764 B2 | 3/2009 | Hirsch | |
| 2005/0143327 A1 | 6/2005 | Hirsch | |
| 2005/0209419 A1* | 9/2005 | Zahn et al. ............ | 526/171 |
| 2008/0213324 A1 | 9/2008 | Zhou et al. | |
| 2011/0124822 A1* | 5/2011 | Yu et al. .............. | 525/389 |

FOREIGN PATENT DOCUMENTS

| | | | |
|---|---|---|---|
| JP | 2005206750 | * 1/2004 | ............ C08G 61/12 |
| KR | 10-0872957 B | 12/2008 | |

OTHER PUBLICATIONS

Liang et al. J. Am. Chem. Soc. 2009, 131, 56-57.*
Scharber et al. "Design Rules for Donors in Bulk-Heterojunction Solar Cells- Towards 10% Energy-Conversion Efficiency" (2006). Advanced Materials, vol. 18, pp. 789-794.
Office Action dated Jul. 10, 2014 for corresponding U.S. Appl. No. 13/293,756.
Office Action for corresponding U.S. Appl. No. 13/293,756 dated Nov. 12, 2014.

* cited by examiner

*Primary Examiner* — Shane Fang
(74) *Attorney, Agent, or Firm* — Harness, Dickey & Pierce, P.L.C.

(57) ABSTRACT

According to example embodiments, an electron-donating polymer includes a repeating unit A including one repeating unit selected from a repeating unit represented by Chemical Formula 1, a repeating unit represented by Chemical Formula 2, and a combination thereof. The polymer also includes a repeating unit B represented by Chemical Formula 3.

20 Claims, 4 Drawing Sheets

ELECTRON DONATING POLYMER AND ORGANIC SOLAR CELL INCLUDING THE SAME

CROSS-REFERENCE TO RELATED APPLICATION

This application claims priority under 35 U.S.C. §119 to Korean Patent Application No. 10-2010-0060234, filed in the Korean Intellectual Property Office on Jun. 24, 2010, and to Korean Patent Application No. 10-2011-0012502, filed in the Korean Intellectual Property Office on Feb. 11, 2011, the entire contents of which are incorporated herein by reference.

BACKGROUND

1. Field

Example embodiments relate to an electron-donating polymer and an organic solar cell including the same.

2. Description of the Related Art

A solar cell is a photoelectric conversion device that transforms solar energy into electrical energy, and has attracted much attention as an infinite but pollution-free next generation energy source.

A solar cell may include p-type and n-type semiconductors and produce electrical energy by transferring electrons and holes to the n-type and p-type semiconductors, respectively, and then collecting electrons and holes in each electrode when an electron-hole pair (EHP) is produced by solar light energy absorbed in a photoactive layer inside the semiconductors.

A solar cell may be classified into an organic solar cell, and an inorganic solar cell according to material included in a photoactive layer. The organic solar cell may be classified into a bi-layer p-n junction structure in which a p-type semiconductor is formed in a separate layer from an n-type semiconductor, and a bulk heterojunction structure in which a p-type semiconductor is mixed with an n-type semiconductor.

SUMMARY

Example embodiments relate to an electron-donating polymer being capable of absorbing light with a wide wavelength region and/or improved hole mobility.

Other example embodiments relate to an organic solar cell being capable of increasing light absorption rate, short circuit current density ($J_{sc}$), and hole mobility, and improving efficiency as a result.

According to example embodiments, an electron-donating polymer includes: at least one repeating unit A represented by one of the following Chemical Formula 1, Chemical Formula 2, and a combination thereof; and a repeating unit B represented by the following Chemical Formula 3.

[Chemical Formula 1]

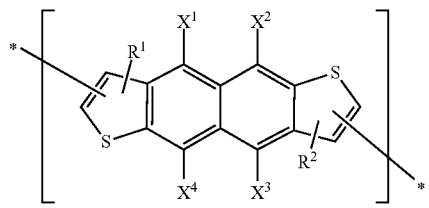

[Chemical Formula 2]

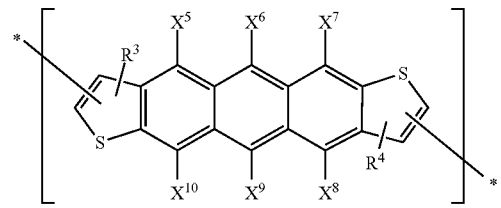

In Chemical Formulae 1 and 2, $X^1$ to $X^{10}$ are the same or different, and $X^1$ to $X^{10}$ are each independently one of hydrogen, a halogen, a substituted or unsubstituted C1 to C20 aliphatic organic group, a hydroxy group, a substituted or unsubstituted C1 to C20 alkoxy group, a substituted or unsubstituted C1 to C20 ester group, a thiol group, or —$SR^{100}$, wherein $R^{100}$ is a substituted or unsubstituted C1 to C20 aliphatic organic group, a substituted or unsubstituted C2 to C30 aromatic organic group, and a substituted or unsubstituted C2 to C30 heterocycloalkyl group. $R^1$ to $R^4$ may be the same or different, and $R^1$ to $R^4$ are each independently one of hydrogen, a substituted or unsubstituted C1 to C20 linear or branched alkyl group, a substituted or unsubstituted C3 to C20 cycloalkyl group, a substituted or unsubstituted C1 to C20 alkoxy group, a substituted or unsubstituted C6 to C30 aryl group, a substituted or unsubstituted C2 to C30 heteroaryl group, and a combination thereof.

[Chemical Formula 3]

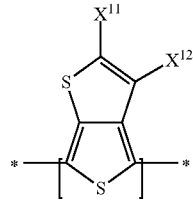

In Chemical Formula 3, $X^{11}$ and $X^{12}$ are the same or different, and $X^{11}$ and $X^{12}$ are each independently one of hydrogen, a halogen, a substituted or unsubstituted C1 to C20 aliphatic organic group, a hydroxy group, a substituted or unsubstituted C1 to C20 alkoxy group, a substituted or unsubstituted C1 to C20 ester group, a thiol group, or —$SR^{103}$, wherein $R^{103}$ is a substituted or unsubstituted C1 to C20 aliphatic organic group, a substituted or unsubstituted C2 to C30 aromatic organic group, and a substituted or unsubstituted C2 to C30 heterocycloalkyl group.

Optionally, in the at least one repeating unit A, one $CH_2$ group included in $R^1$ to $R^4$ or at least two non-adjacent $CH_2$ groups included in $R^1$ to $R^4$ may be substituted with one of —O—, —S—, —$SO_2$—, —CO—, —OCO—, —COO—, —C=C—, —C≡C— and —$SiR^{101}R^{102}$ (wherein $R^{101}$ and $R^{102}$ are the same or different, and are each independently one of hydrogen, a substituted or unsubstituted C1 to C20 linear or branched alkyl group, a substituted or unsubstituted C3 to C20 cycloalkyl group, a substituted or unsubstituted C1 to C20 alkoxy group, a substituted or unsubstituted C6 to C30 aryl group, a substituted or unsubstituted C2 to C30 heteroaryl group, and a combination thereof).

The at least one repeating unit A may include at least one repeating unit represented by one of the following Chemical Formulae 4 to 9 and a combination thereof.

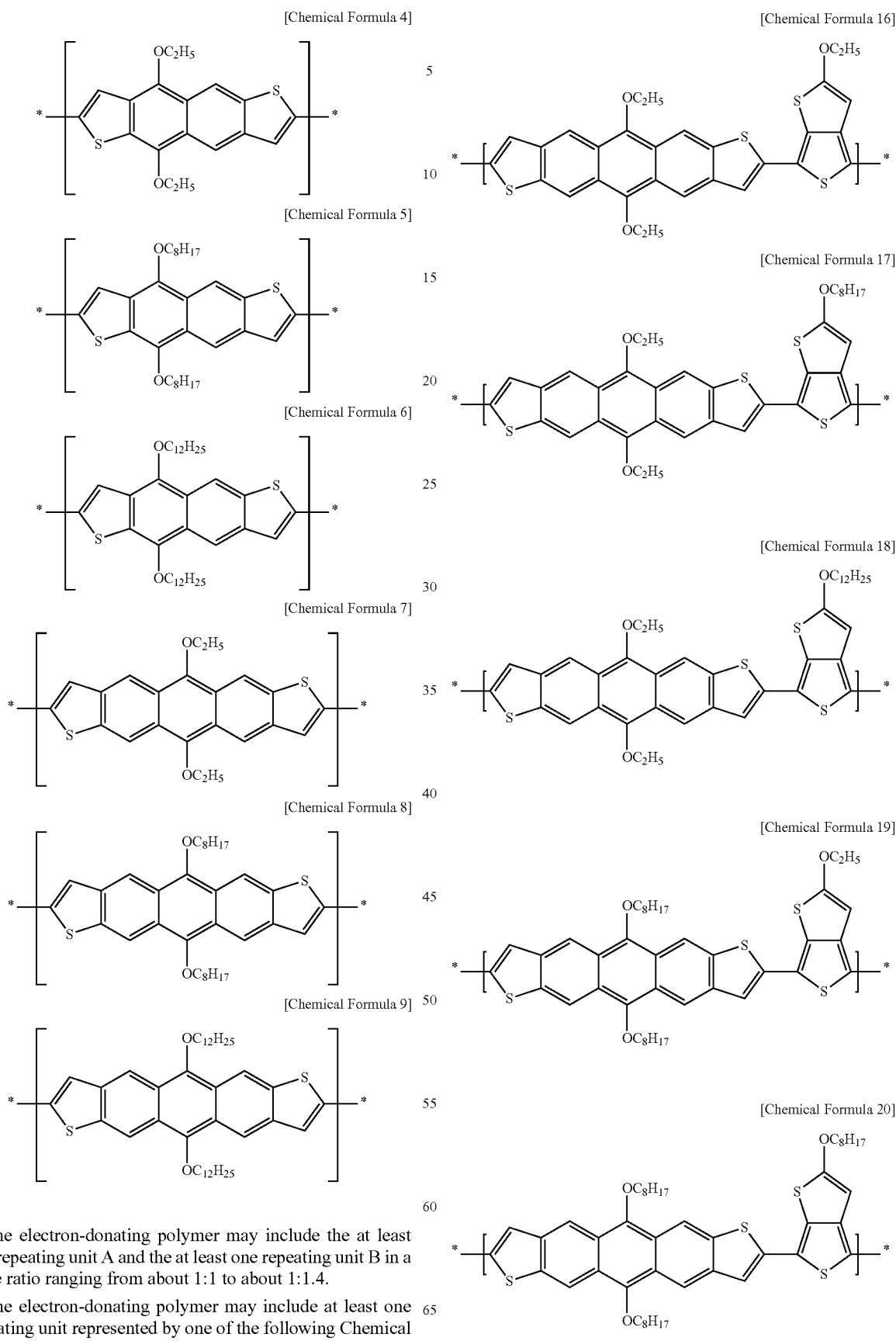
The electron-donating polymer may include the at least one repeating unit A and the at least one repeating unit B in a mole ratio ranging from about 1:1 to about 1:1.4.
The electron-donating polymer may include at least one repeating unit represented by one of the following Chemical Formulae 16 to 33, and a combination thereof.

[Chemical Formula 21]
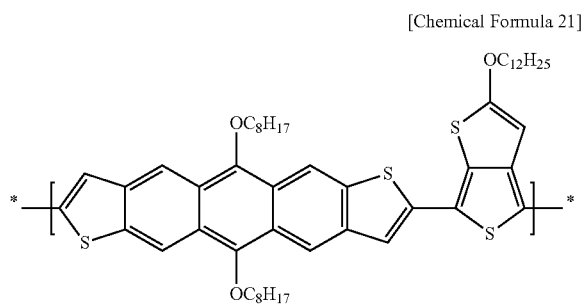
[Chemical Formula 22]
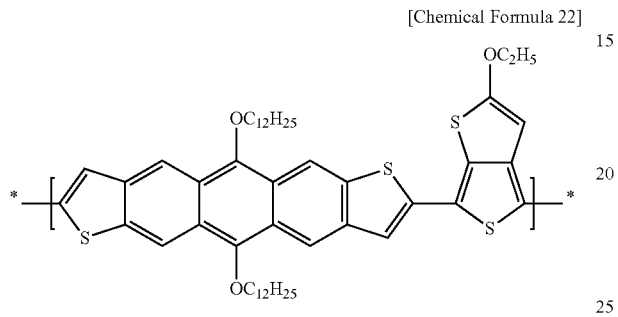
[Chemical Formula 23]
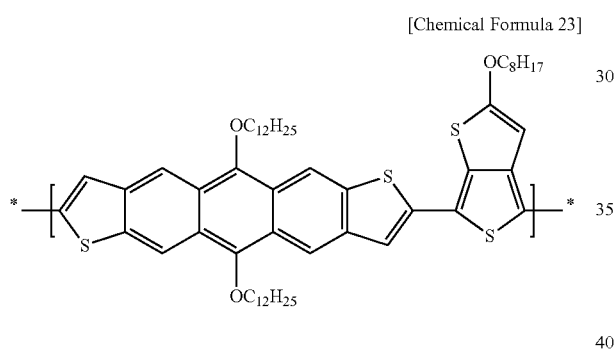
[Chemical Formula 24]
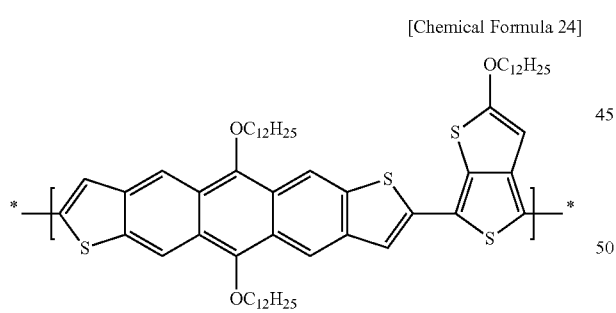
[Chemical Formula 25]
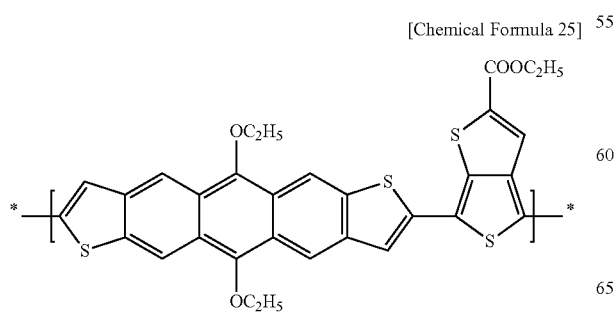
[Chemical Formula 26]
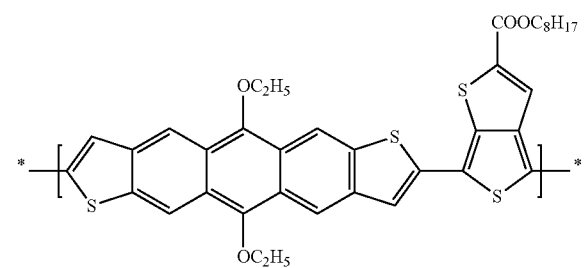
[Chemical Formula 27]
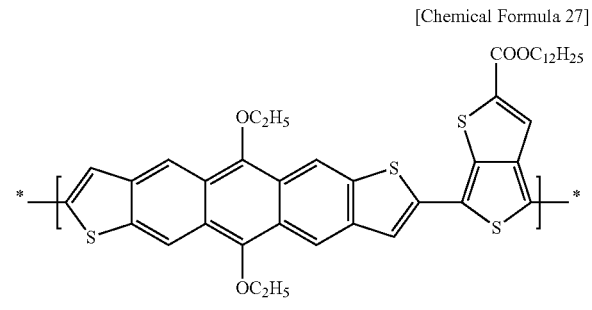
[Chemical Formula 28]
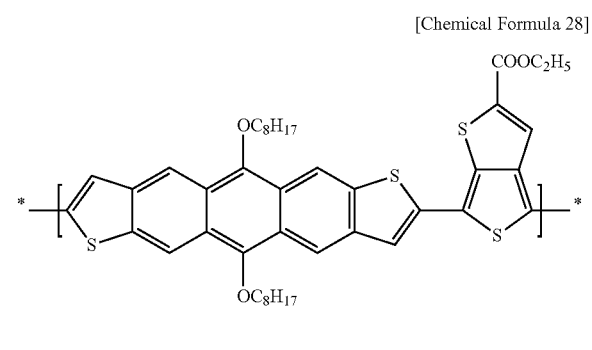
[Chemical Formula 29]
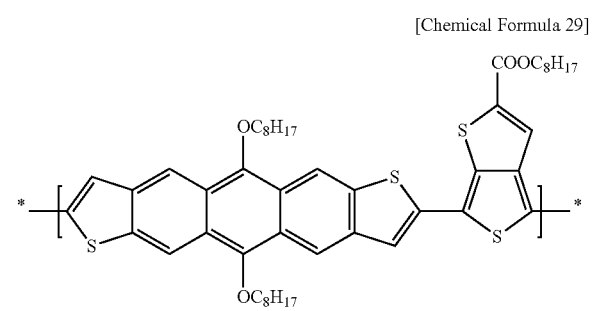
[Chemical Formula 30]
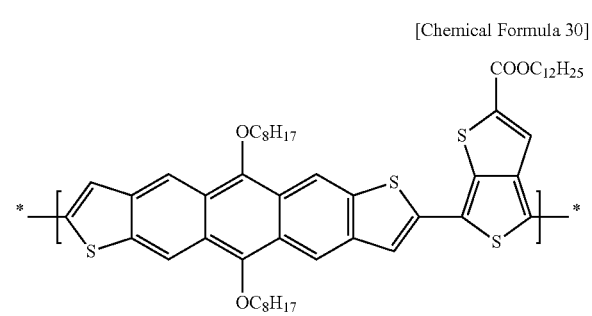

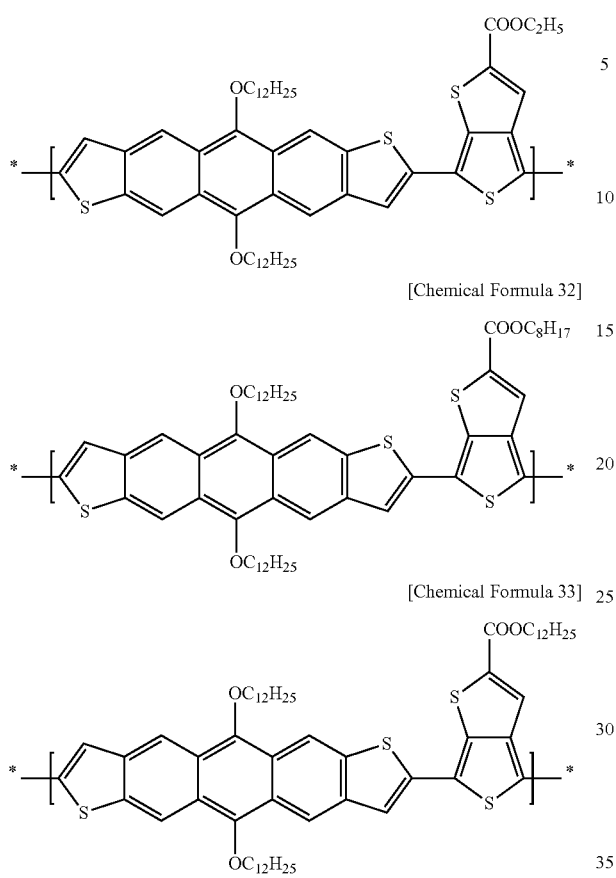

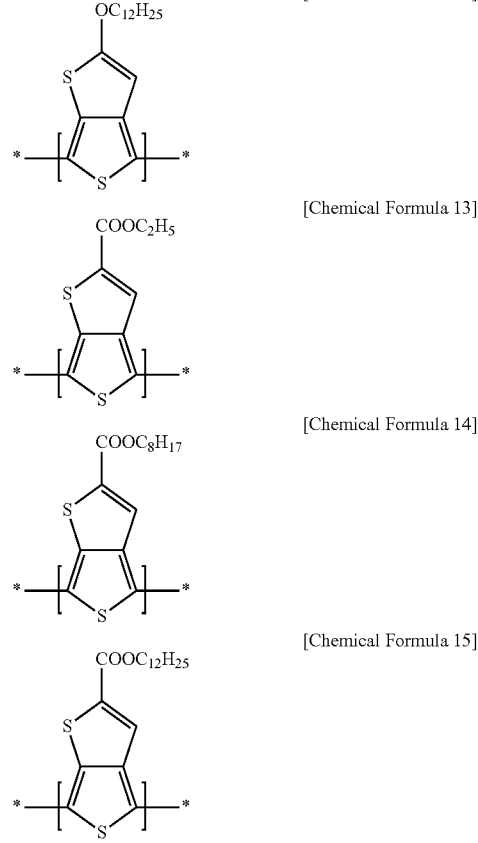

The electron-donating polymer may have a number average molecular weight ranging from about 1000 to about 800,000. In addition, the electron-donating polymer may have a band gap ranging from about 1.2 eV to about 2.5 eV.

The at least one repeating unit B may include at least one repeating unit represented by one of the following Chemical Formulae 10 to 15 and a combination thereof.

Further, the electron-donating polymer may include the at least one repeating unit A and the at least one repeating unit B in a mole ratio ranging from about 1:1.001 to about 1:1.2.

According example embodiments, a photoactive layer includes the electron-donating polymer.

According example embodiments, an electronic device includes the photoactive layer.

According example embodiments, an organic solar cell includes a substrate, an anode and a cathode facing each other and on the substrate, and a photoactive layer disposed between the anode and the cathode and including an electron donor including the electron-donating polymer according to example embodiments and an electron acceptor.

The substrate of the organic solar cell may include at least one of glass, polycarbonate, polymethylmethacrylate, polyethylene terephthalate, polyethylene naphthalate, polyamide, and polyethersulfone. The anode or the cathode of the organic solar cell may include one of indium tin oxide (ITO), indium-doped zinc oxide (IZO), tin oxide (SnO2), aluminum-doped zinc oxide (AZO), gallium-doped zinc oxide (GZO), and combinations thereof. The other of the anode or the cathode may include one of aluminum (Al), silver (Ag), gold (Au), lithium (Li), and combinations thereof. The electron acceptor material may include one of C60, C70, C74, C76, C78, C82, C84, C720, C860, C61-PCBM, C71-PCBM, C84-PCBM, bis-PCBM, perylene; CdS, CdTe, CdSe, ZnO, and a combination thereof.

Further example embodiments are described in the following detailed description.

BRIEF DESCRIPTION OF THE DRAWINGS

Example embodiments will be more clearly understood from the following brief description taken in conjunction with the accompanying drawings, in which.

Figure 1:
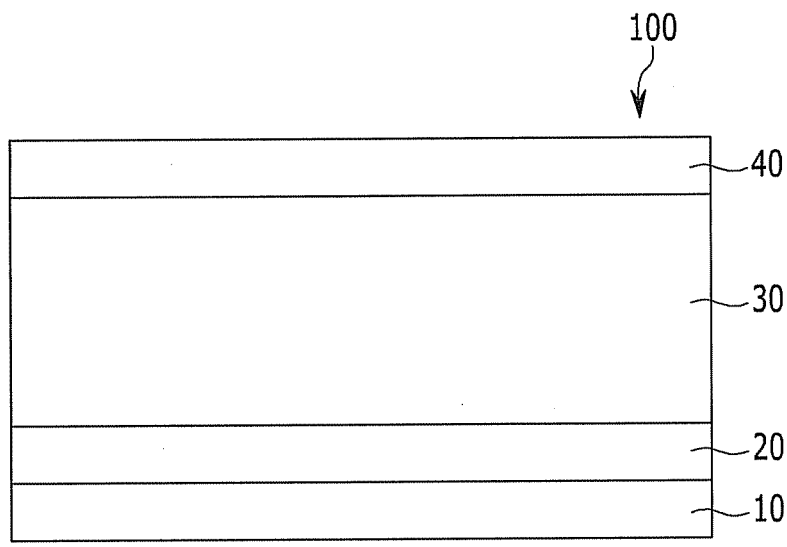
FIG. 1 is a cross-sectional view showing an organic solar cell according to example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of like reference numbers in the various drawings is intended to indicate the presence of like elements or features throughout the different views.

DETAILED DESCRIPTION

Example embodiments will hereinafter be described in further detail with reference to the accompanying drawings, in which various example embodiments are shown. This disclosure may, however, be embodied in many different forms and should not be construed as limited to the example embodiments set forth herein; rather, these example embodiments are provided so that this disclosure will be thorough and complete, and will fully convey inventive concepts of example embodiments to those of ordinary skill in the art.

As used herein, when a specific definition is not otherwise provided, the term "substituted" refers to one substituted with at least one substituent including a halogen (F, Br, Cl, or I), a hydroxy group, a nitro group, a cyano group, an amino group ($NH_2$, $NH(R^{200})$, or $N(R^{201})(R^{202})$, wherein $R^{200}$, $R^{201}$, and $R^{202}$ are the same or different, and are each independently a C1 to C10 alkyl group), an amidino group, a hydrazine group, a hydrazone group, a carboxyl group, a substituted or unsubstituted alkyl group, a substituted or unsubstituted haloalkyl group, a substituted or unsubstituted alkoxy group, a substituted or unsubstituted alkenyl group, a substituted or unsubstituted alkynyl group, a substituted or unsubstituted aryl group, a substituted or unsubstituted heteroaryl group, and a substituted or unsubstituted heterocycloalkyl group in place of at least one hydrogen of a functional group.

As used herein, when a specific definition is not otherwise provided, the term "aliphatic" may refer to C1 to C20 alkyl, a C2 to C20 alkenyl, a C2 to C20 alkynyl, a C1 to C20 alkylene, a C2 to C20 alkenylene, or a C2 to C20 alkynylene, and specifically a C1 to C15 an alkyl, a C2 to C15 alkenyl, a C2 to C15 alkynyl, a C1 to C15 alkylene, a C2 to C15 alkenylene, or a C2 to C15 alkynylene, and more specifically a C1 to C10 an alkyl, a C2 to C10 alkenyl, a C2 to C10 alkynyl, a C1 to C10 alkylene, a C2 to C10 alkenylene, or a C2 to C10 alkynylene, and the term "aromatic" may refer to a C6 to C30 aryl, a C2 to C30 heteroaryl, a C6 to C30 arylene, or a C2 to C30 heteroarylene, and specifically a C6 to C20 aryl, a C2 to C20 heteroaryl, a C6 to C20 arylene, or a C2 to C20 heteroarylene.

As used herein, when a specific definition is not otherwise provided, the term "heterocycloalkyl group", "heteroaryl group", and "heteroarylene group" may independently refer to a cycloalkyl group, an aryl group, and an arylene group including at least one heteroatom of N, O, S, Si, or P and remaining carbon in one cycle.

As used herein, when a specific definition is not otherwise provided, the term "alkyl group" may refer to a C1 to C20 alkyl group, specifically, a C1 to C15 alkyl group, and more specifically a C1 to C10 alkyl group, the term "cycloalkyl group" may refer to a C3 to C20 cycloalkyl group, specifically a C3 to C15 cycloalkyl group, and more specifically a C3 to C10 cycloalkyl group, the term "alkylene group" may refer to a C1 to C20 alkylene group, specifically a C1 to C15 alkylene group, and more specifically a C1 to C10 alkylene group, the term "alkenyl group" may refer to a C2 to C20 alkenyl group, specifically a C2 to C15 alkenyl group, and more specifically a C2 to C10 alkenyl group, the term "alkenylene group" may refer to a C2 to C20 alkenylene group, specifically a C2 to C15 alkenylene group, and more specifically a C2 to C10 alkenylene group, the term "an alkynyl group" may refer to a C2 to C20 alkynyl group, specifically a C2 to C15 alkynyl group, and more specifically a C2 to C10 alkynyl group, the term "an alkynylene group" may refer to a C2 to C20 alkynylene group, specifically a C2 to C15 alkynylene group, and more specifically a C2 to C10 alkynylene group, the term "alkoxy group" may refer to a C1 to C20 alkoxy group, specifically a C1 to C15 alkoxy group, and more specifically a C1 to C10 alkoxy group, the term "ester group" may refer to a C1 to C20 ester group, specifically a C1 to C15 ester group, and more specifically a C1 to C10 ester group, the term "aryl group" may refer to a C6 to C30 aryl group, specifically a C6 to C20 aryl group, and more specifically a C6 to C15 an aryl group, the term "heterocycloalkyl group" may refer to a C2 to C30 heterocycloalkyl group, specifically a C2 to C20 heterocycloalkyl group, and the term "halogen" refers to F, Cl, Br, or I.

As used herein, when a definition is not otherwise provided, "combination" commonly refers to mixing or copolymerization. Herein, "copolymerization" refers to block copolymerization to random copolymerization, and "copolymer" may refer to a block copolymer to a random copolymer.

In addition, in the specification, the mark "*" may refer to where something is connected with the same or different atom or chemical formula.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

According to example embodiments, an electron-donating polymer may include repeating unit A including at least one repeating unit selected from the group consisting of a repeating unit represented by the following Chemical Formula 1, a repeating unit represented by the following Chemical Formula 2, and a combination thereof, and a repeating unit B represented by the following Chemical Formula 3.

[Chemical Formula 1]

[Chemical Formula 2]

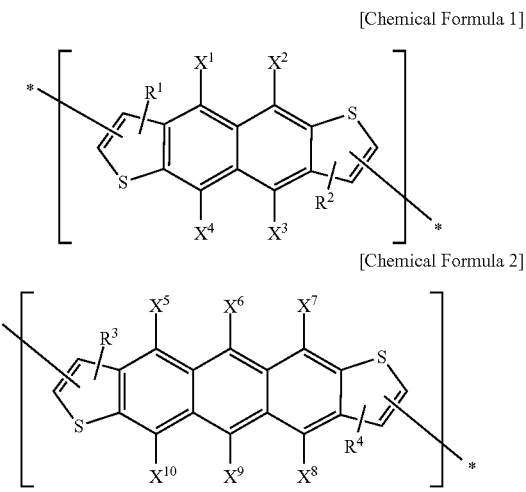

In Chemical Formulae 1 and 2, $X^1$ to $X^{10}$ are the same or different, and are each independently selected from hydrogen, a halogen, a substituted or unsubstituted C1 to C20 aliphatic organic group, a hydroxy group, a substituted or unsubstituted C1 to C20 alkoxy group, a substituted or unsubstituted C1 to C20 ester group, a thiol group, or —$SR^{100}$. Herein, $R^{100}$ is a substituted or unsubstituted C1 to C20 aliphatic organic group, a substituted or unsubstituted C2 to C30 aromatic organic group, or a substituted or unsubstituted C2 to C30 heterocycloalkyl group, specifically a substituted or unsubstituted C1 to C20 alkyl group.

When $X^1$ to $X^{10}$ are an alkenyl group or an alkynyl group, $X^1$ to $X^{10}$ may include one or two carbon-carbon unsaturated bonds, for example, a carbon-carbon double bond and a carbon-carbon triple bond.

$R^1$ to $R^4$ are the same or different, and are each independently selected from hydrogen, a substituted or unsubstituted C1 to C20 linear or branched alkyl group, a substituted or unsubstituted C3 to C20 cycloalkyl group, a substituted or unsubstituted C1 to C20 alkoxy group, a substituted or unsubstituted C6 to C30 aryl group, a substituted or unsubstituted C2 to C30 heteroaryl group, and a combination thereof. Optionally one $CH_2$ group included in $R^1$ to $R^4$ or two or more non-adjacent $CH_2$ groups included in $R^1$ to $R^4$ are substituted with —O—, —S—, —$SO_2$—, —CO—, —OCO—, —COO—, —C=C—, —C≡C—, and —$SiR^{101}R^{102}$— (wherein $R^{101}$ and $R^{102}$ are the same or different, and are each independently selected from hydrogen, a substituted or unsubstituted C1 to C20 linear or branched alkyl group, a substituted or unsubstituted C3 to C20 cycloalkyl group, a substituted or unsubstituted C1 to C20 alkoxy group, a substituted or unsubstituted C6 to C30 aryl group, a substituted or unsubstituted C2 to C30 heteroaryl group, and a combination thereof).

[Chemical Formula 3]

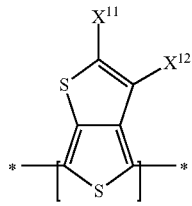

In Chemical Formula 3, $X^{11}$ and $X^{12}$ are the same or different, and are each independently selected from hydrogen, a halogen, a substituted or unsubstituted C1 to C20 aliphatic organic group, a hydroxy group, a substituted or unsubstituted C1 to C20 alkoxy group, a substituted or unsubstituted C1 to C20 ester group, a thiol group, or —$SR^{103}$. Herein, $R^{103}$ is a substituted or unsubstituted C1 to C20 aliphatic organic group, a substituted or unsubstituted C2 to C30 aromatic organic group, or a substituted or unsubstituted C2 to C30 heterocycloalkyl group, and specifically, a substituted or unsubstituted C1 to C20 alkyl group. When $X^{11}$ and $X^{12}$ include an alkenyl group or an alkynyl group, the $X^{11}$ and $X^{12}$ may include a carbon-carbon unsaturated bond, for example, one or two carbon-carbon double bonds and carbon-carbon triple bonds.

The electron-donating polymer includes a polycyclic aromatic group such as the repeating unit A, which increases interaction among polymers and thus decreases a band gap. Accordingly, the electron-donating polymer may absorb solar light in a wider wavelength region. In addition, the increased interaction among polymers improves the stacking structure of the electron-donating polymer, and thus its hole mobility. As a result, the electron-donating polymer may have an improved fill factor (FF). Accordingly, when the electron-donating polymer is applied to an organic solar cell, the photoelectric conversion efficiency of the organic solar cell may be improved.

The repeating unit A may include at least one repeating unit selected from the group consisting of repeating units represented by the following Chemical Formulae 4 to 9 and a combination thereof, but is not limited thereto.

[Chemical Formula 4]

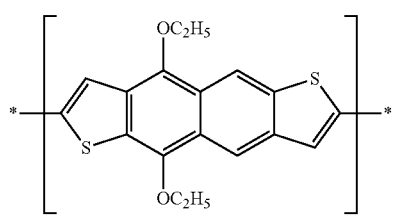

-continued

[Chemical Formula 5]
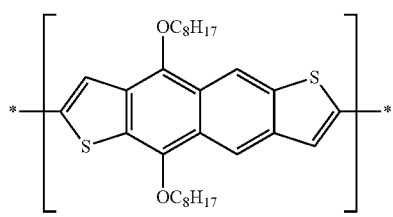

[Chemical Formula 6]
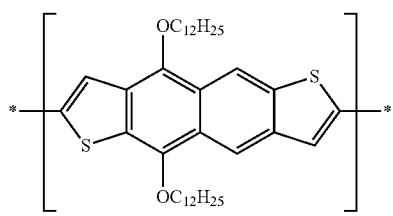

[Chemical Formula 7]
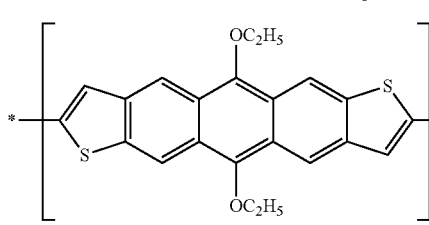

[Chemical Formula 8]
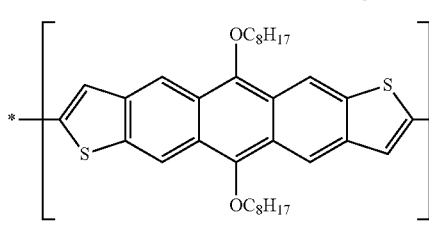

[Chemical Formula 9]
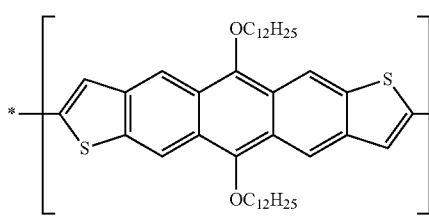

In the electron-donating polymer, the repeating unit B may be an electron-accepting group.

In particular, the repeating unit B may include one of the repeating units represented by the one of following Chemical Formulae 10 to 15 and a combination thereof, but example embodiments are not limited thereto.

[Chemical Formula 10]
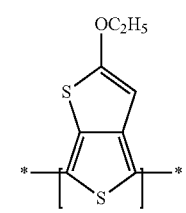

[Chemical Formula 11]
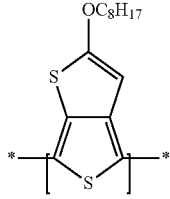

[Chemical Formula 12]
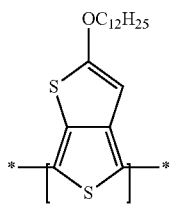

[Chemical Formula 13]
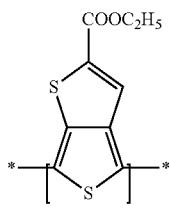

[Chemical Formula 14]
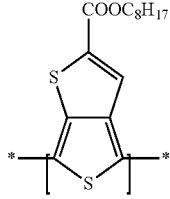

[Chemical Formula 15]
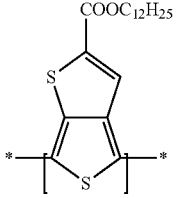

The electron-donating polymer may include the repeating unit A and the repeating unit B in a mole ratio ranging from about 1:1 to about 1:1.4. When the repeating units A and B are included within the mole ratio range, the number average molecular weight of the electron-donating polymer may be effectively controlled. In addition, the electron-donating polymer may be prepared using a solution process. In particular, the electron-donating polymer may include the repeating units A and B in a mole ratio ranging from about 1:1.001 to about 1:1.2.

More particularly, the electron-donating polymer may include one of repeating units represented by the following Chemical Formulae 16 to 33, or a combination thereof, but is not limited thereto.

[Chemical Formula 16]
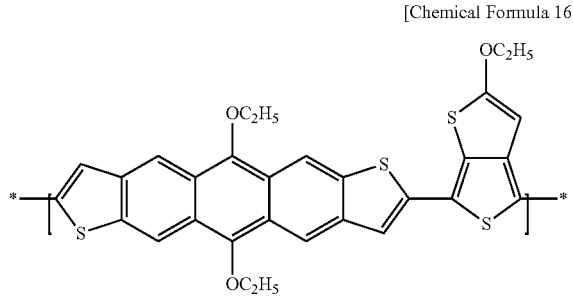
[Chemical Formula 17]
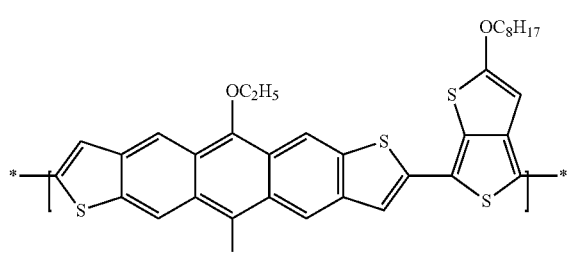
[Chemical Formula 18]
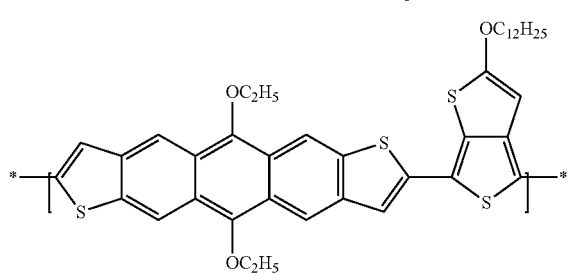
[Chemical Formula 19]
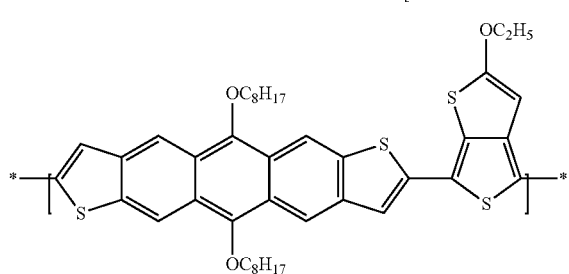
[Chemical Formula 20]
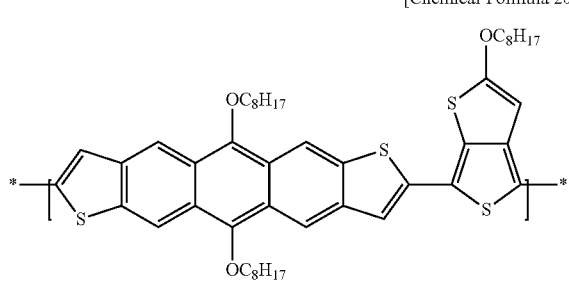
-continued
[Chemical Formula 21]
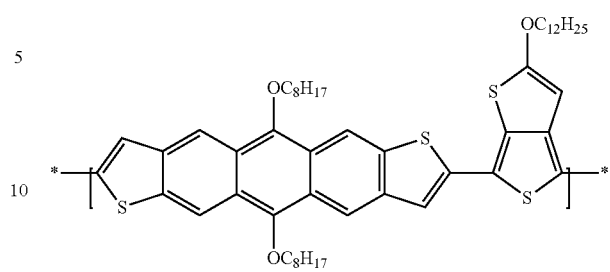
[Chemical Formula 22]
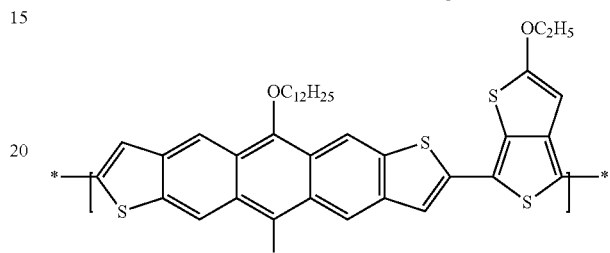
[Chemical Formula 23]
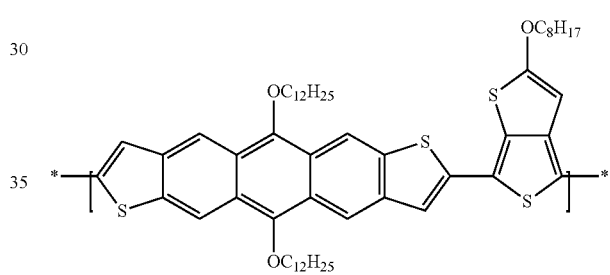
[Chemical Formula 24]
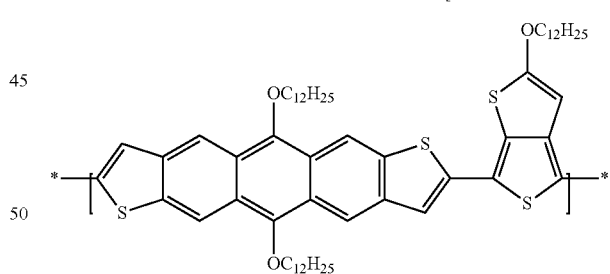
[Chemical Formula 25]
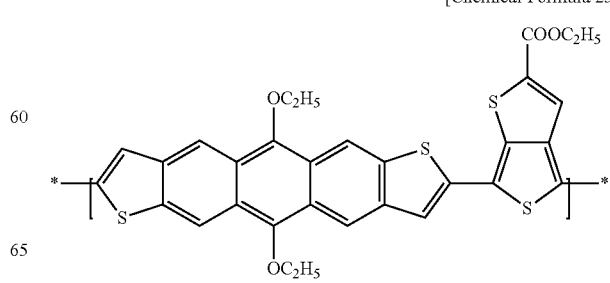

[Chemical Formula 26]

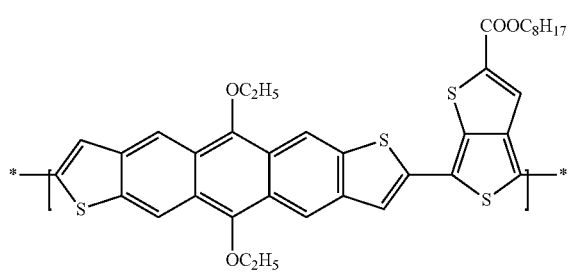

[Chemical Formula 27]

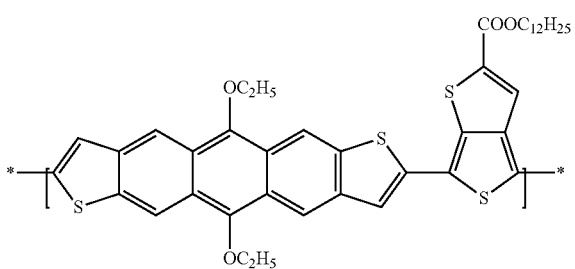

[Chemical Formula 28]

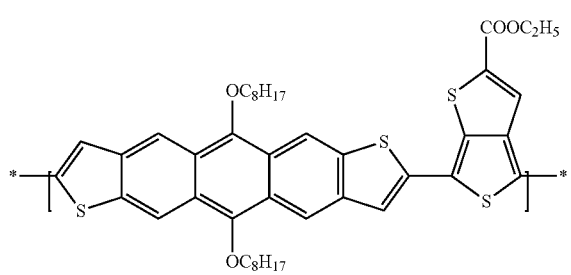

[Chemical Formula 29]

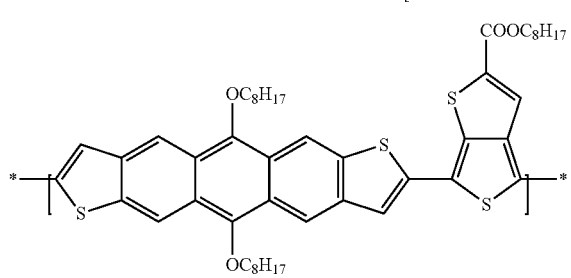

[Chemical Formula 30]

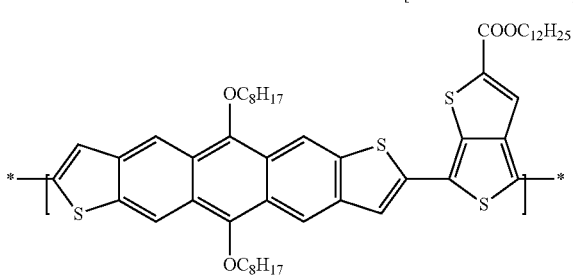

[Chemical Formula 31]

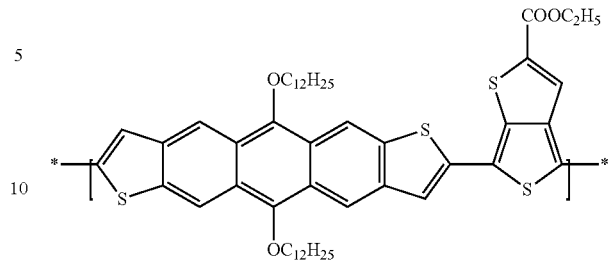

[Chemical Formula 32]

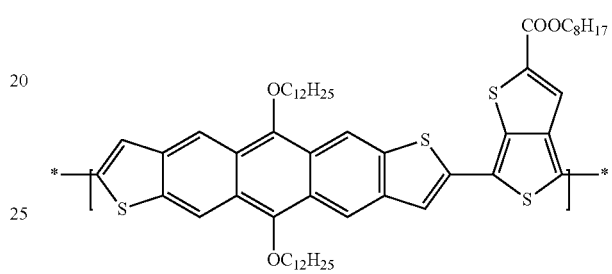

[Chemical Formula 33]

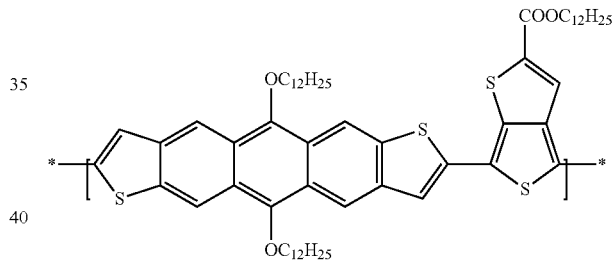

The electron-donating polymer may have a number average molecular weight ranging from about 1000 to about 800,000. When an electron-donating polymer has a number average molecular weight within the range, a composition of a solution for preparing the electron-donating polymer may be easily controlled. As a result, properties of the electron-donating polymer may be effectively controlled. In addition, the electron-donating polymer may be applied to an organic solar cell. In particular, the electron-donating polymer may have a number average molecular weight ranging from about 2,000 to about 100,000, and more particularly, from about 2000 to about 50,000.

The electron-donating polymer may have a band gap ranging from about 1.2 eV to about 2.5 eV. When the electron-donating polymer has a band gap within the range, the electron-donating polymer may absorb solar light in a wide wavelength region and increase short circuit current density (Jsc), and thus improve efficiency of an organic solar cell. In particular, the electron-donating polymer may have a band gap ranging from about 1.3 eV to about 2.0 eV, and from about 1.35 eV to about 2.0 eV.

According to example embodiments, a photoactive layer includes the electron-donating polymer.

The photoactive layer may be used in various electronic devices.

One of the electronic devices may be an organic solar cell.

Hereinafter, referring to FIG. 1, an organic solar cell according to example embodiments is illustrated.

FIG. 1 provides a cross-sectional view of an organic solar cell according to example embodiments.

Referring to FIG. 1, an organic solar cell 100 according to example embodiments may include, a substrate 10, a lower electrode 20 on one surface of the substrate 10, a photoactive layer 30 on one surface of the lower electrode 20, and an upper electrode 40 on one surface of the photoactive layer 30.

The substrate 10 may be include a light-transmitting material, for example, an inorganic material such as glass or an organic material such as polycarbonate, polymethylmethacrylate, polyethylene terephthalate, polyethylene naphthalate, polyamide, and polyethersulfone.

Either of the lower electrode 20 and the upper electrode 40 is an anode, while the other is a cathode. Either of the lower electrode 20 and the upper electrode 40 may be made of a transparent conductor such as indium tin oxide (ITO), indium-doped zinc oxide (IZO), tin oxide ($SnO_2$), aluminum-doped zinc oxide (AZO), gallium-doped zinc oxide (GZO), and the like, while the other is made of an opaque conductor such as aluminum (Al), silver (Ag), gold (Au), lithium (Li), and the like.

The photoactive layer 30 may include an electron acceptor made of an n-type semiconductor material and an electron donor made of a p-type semiconductor material.

The electron acceptor may include, for example, fullerene with large electron affinity (C60, C70, C74, C76, C78, C82, C84, C720, C860, and the like); fullerene derivatives such as 1-(3-methoxy-carbonyl)propyl-1-phenyl(6,6)C61 (PCBM), C71-PCBM, C84-PCBM, bis-PCBM, and the like; perylene; an inorganic semiconductor such as CdS, CdTe, CdSe, ZnO, and the like; or a combination thereof.

The electron donor includes the aforementioned electron-donating polymer. When the electron-donating polymer is included, the organic solar cell may have a higher short circuit current density (Jsc) than a conventional organic solar cell and improved hole mobility. Accordingly, the organic solar cell may have improved photoelectric conversion efficiency.

The electron acceptor and the electron donor may have, for example, a bulk heterojunction structure. The bulk heterojunction structure generates a photocurrent by diffusing a pair of electron-holes excited by light absorbed in the photoactive layer 30 into an interface between the electron acceptor and the electron donor, separating the pair of electron-holes into electrons and holes due to an electronic affinity difference of two materials on the interface, and moving the electrons through the electron acceptor to the cathode and the holes through the electron donor to the anode.

Herein, the electron-donating polymer is applied to provide a photoactive layer for an organic solar cell, but may be used for a photoactive layer for other electronic devices, such as an organic light emitting diode ("OLED"), and an organic thin film transistor ("OTFT").

Hereinafter, example embodiments are described in more detail with reference to following examples. However, example embodiments are not limited to the following examples.

EXAMPLES

Example 1

Preparation of an Electron-Donating Polymer

An electron-donating polymer is prepared according to the following Reaction Scheme 1.

[Reaction Scheme 1]

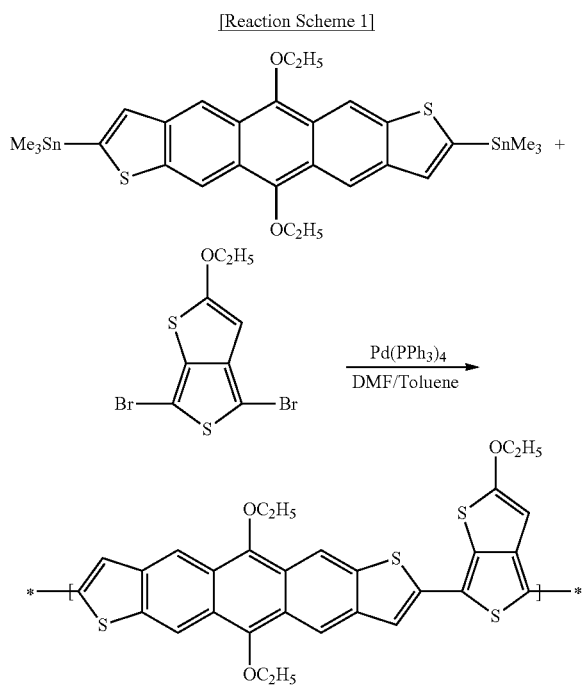

0.02 mol of bis(trimethyl tin)-1,8-bis(ethyloxy)anthro[1,2-b:4,5-b']dithiophene and 0.02 mol of ethyloxy-6-dibromo-thieno[3,3-b]thiophene are added to 5 ml of DMF/toluene (dimethylformamide/toluene) (volume ratio=1:4), and Pd(PPh$_3$)$_4$ as a catalyst is added thereto. The mixture is agitated at 120° C. for 6 hours to prepare an electron-donating polymer. The electron-donating polymer has a number average molecular weight of 18000.

Example 2

Preparation of an Electron-Donating Polymer

An electron-donating polymer is prepared according to the following Reaction Scheme 2.

[Reaction Scheme 2]

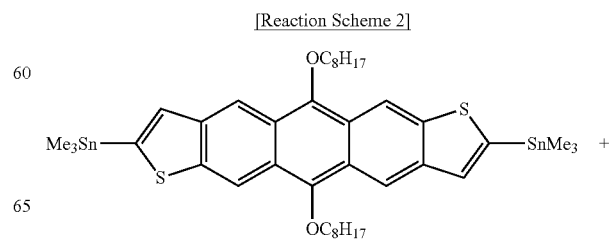

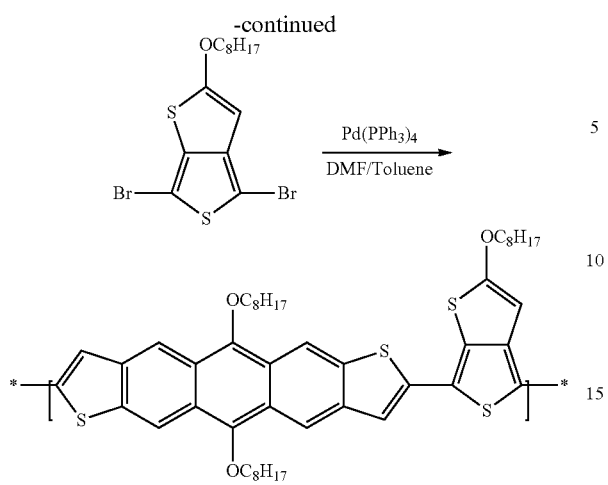

0.02 mol of bis(trimethyltin)-1,8-bis(octyloxy)anthro[1,2-b:4,5-b']dithiophene and 0.02 mol of octyloxy-6-dibromo-thieno[3,3-b]thiophene are added to 5 ml of DMF/toluene (dimethylformamide/toluene) (volume ratio=1:4), and Pd(PPh$_3$)$_4$ as a catalyst is added thereto. The mixture is agitated at 120° C. for 6 hours to prepare an electron-donating polymer. The electron-donating polymer has a number average molecular weight of 23000.

Example 3

Preparation of an Electron-Donating Polymer

An electron-donating polymer is prepared according to the following Reaction Scheme 3.

[Reaction Scheme 3]

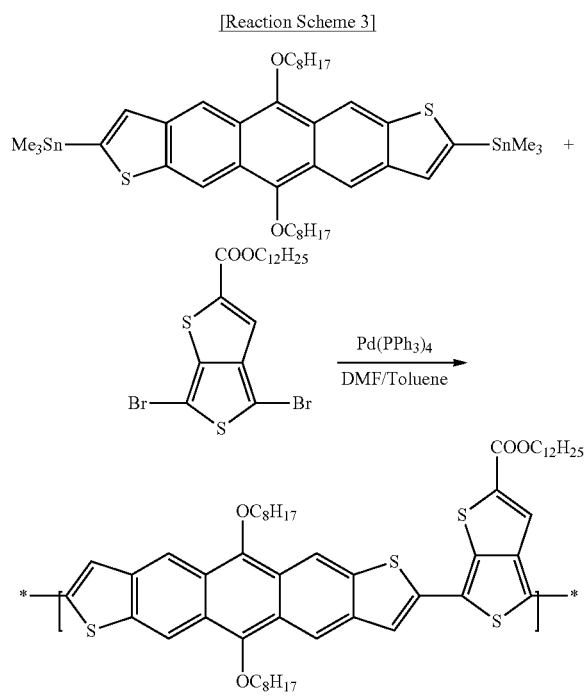

0.02 mol of bis(trimethyl tin)-1,8-bis(octyloxy)anthro[1,2-b:4,5-b']dithiophene and 0.02 mol of dodecyl carboxy-6-dibromo-thieno[3,4-b]thiophene are added to 5 ml of DMF/ toluene (dimethylformamide/toluene) (volume ratio=1:4), and Pd(PPh$_3$)$_4$ as a catalyst is added thereto. The mixture is agitated at 120° C. for 6 hours to prepare an electron-donating polymer. The electron-donating polymer has a number average molecular weight of 21000.

Comparative Example 1

Preparation of an Electron-Donating Polymer

The polymer including the repeating unit represented by the following Chemical Formula 34 is used as an electron-donating polymer. The electron-donating polymer has a number average molecular weight of 23000.

[Chemical Formula 34]

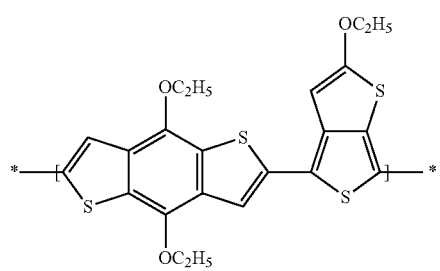

Comparative Example 2

Preparation of an Electron-Donating Polymer

The polymer including the repeating unit represented by the following Chemical Formula 35 is used as an electron-donating polymer. The electron-donating polymer has a number average molecular weight of 19000.

[Chemical Formula 35]

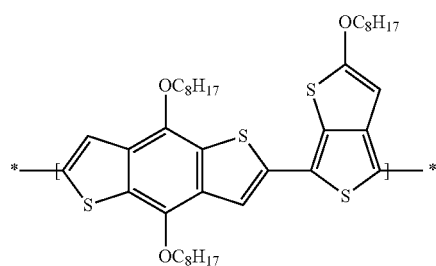

Comparative Example 3

Preparation of an Electron-Donating Polymer

The polymer including the repeating unit represented by the following Chemical Formula 36 is used as an electron-donating polymer. The electron-donating polymer has a number average molecular weight of 21000.

[Chemical Formula 36]

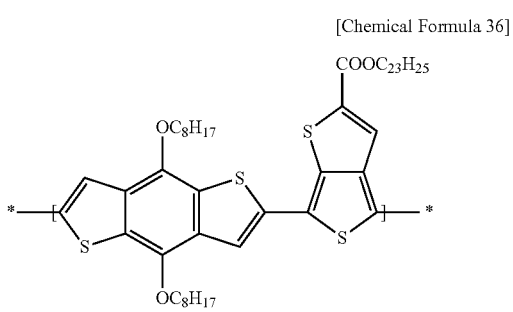

Comparative Example 4

Preparation of an Electron-Donating Polymer

The polymer including the repeating unit represented by the following Chemical Formula 37 is used as an electron-donating polymer. The electron-donating polymer has a number average molecular weight of 25000.

[Chemical Formula 37]

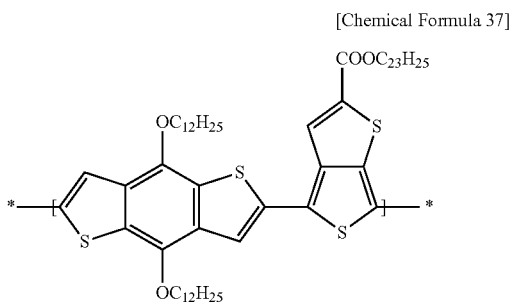

Experimental Example 1

IR Measurement

Figure 2:
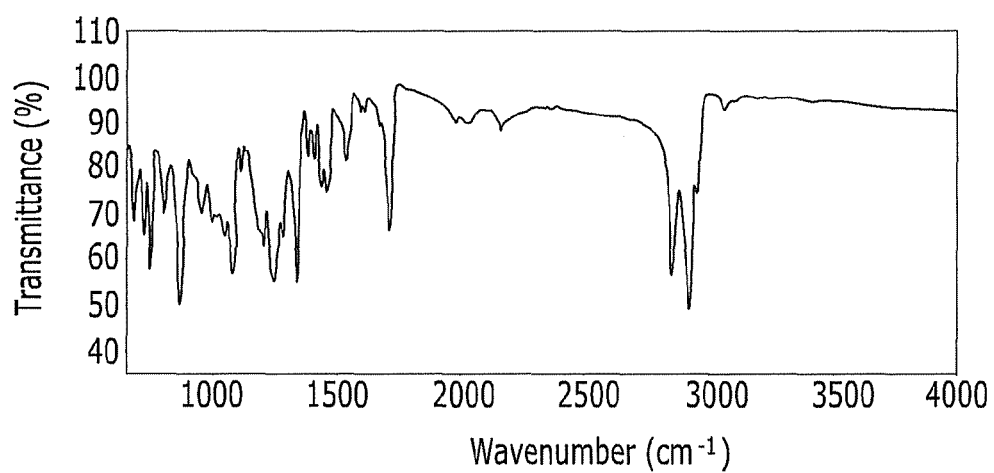
FIG. 2 provides an IR spectrum of an electron-donating polymer according to Example 3.

The electron-donating polymers according to Examples 1 to 3 and Comparative Examples 1 and 2 are respectively evaluated regarding the IR spectrum according to an ATR method by using a Bio Rad FTS 6000 FTIR spectrometer. FIG. 2 shows the IR spectrum of the electron-donating polymer according to Example 3.

Referring to FIG. 2, the spectrum has a 2954 $cm^{-1}$ peak showing aromatic CH stretching, a 2848 $cm^{-1}$ peak showing aliphatic CH stretching, a 1705 $cm^{-1}$ peak showing C=O stretching, and 1240 $cm^{-1}$ and 1082 $cm^{-1}$ peaks showing C—O stretching. Accordingly, the electron-donating polymer of Example 3 is identified to be a product prepared according to Reaction Scheme 3.

Experimental Example 2

Band Gap Measurement

The electron-donating polymers according to Examples 1 to 3 and Comparative Examples 1 and 2 are respectively measured regarding HOMO level, LUMO level, and band gap through band structure simulation in a Gaussian 03 method by using super computer HP DL160 G6. The result is provided in the following Table 1.

TABLE 1

|  | HOMO(eV) | LUMO(eV) | Band gap (eV) |
| --- | --- | --- | --- |
| Example 1 | −4.53 | −2.57 | 1.96 |
| Comparative Example 1 | −5.00 | −2.9 | 2.10 |
| Example 2 | −4.50 | −2.60 | 1.90 |
| Comparative Example 2 | −5.01 | −2.89 | 2.12 |
| Example 3 | −4.40 | −3.02 | 1.38 |
| Comparative Example 3 | −5.0 | −3.28 | 1.62 |
| Comparative Example 4 | −5.01 | −3.24 | 1.77 |

As shown in Table 1, the electron-donating polymer of Example 1 has a smaller band gap than the electron-donating polymer of Comparative Example 1, the electron-donating polymer of Example 2 has a smaller band gap than the electron-donating polymer of Comparative Example 2, and the electron-donating polymer of Example 3 has a smaller band gap than the electron-donating polymer of Comparative Examples 3 and 4.

The reason is that a polycyclic aromatic group included in the electron-donating polymers according to Examples 1 to 3 is believed to increase interaction among polymers and thus decrease the band gap.

Experimental Example 3

Evaluation of Light Absorption Characteristics

The electron-donating polymers according to Examples 1 to 3 and Comparative Examples 1 and 2 are respectively dissolved in dichlorobenzene. Each, solution is dripped on a glass. The solution is dried to remove the solvent therein and acquire a film. Each film is evaluated regarding ultraviolet-visible ray (UV-Vis) absorption spectrum by using Cary 5000 UV spectroscopy equipment made by Varian, Inc.

Figure 3:
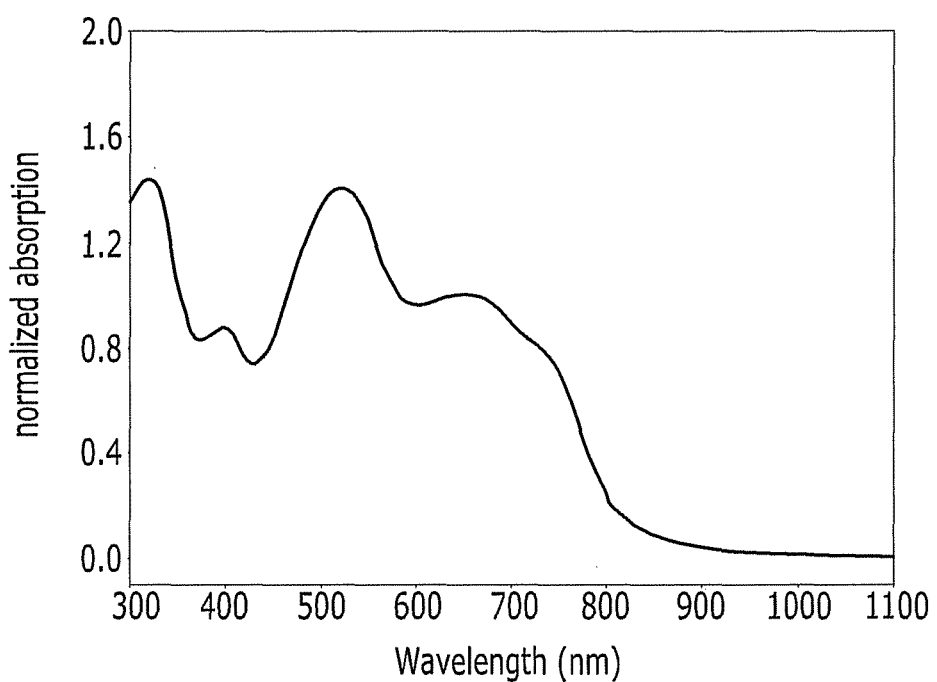
FIG. 3 provides an ultraviolet-visible ray (UV-Vis) absorption spectrum of the electron-donating polymer according to Example 3.
Figure 4:
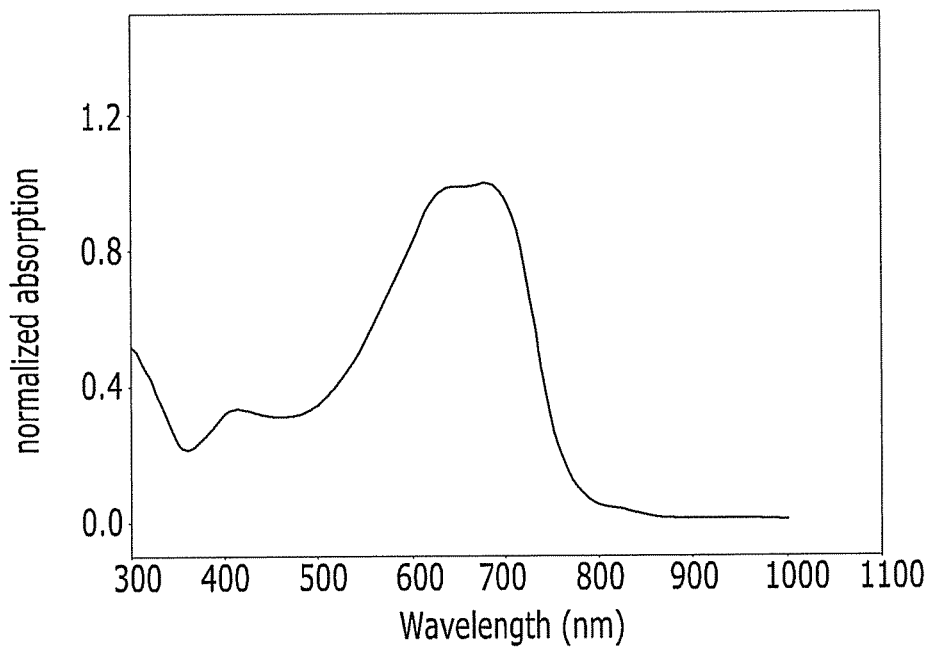
FIG. 4 provides an ultraviolet-visible ray (UV-Vis) absorption spectrum of an electron-donating polymer according to Comparative Example 3.

FIG. 3 provides the ultraviolet-visible ray (UV-Vis) absorption spectrum of the electron-donating polymer according to Example 3, and FIG. 4 provides the ultraviolet-visible ray (UV-Vis) absorption spectrum of the electron-donating polymer according to Comparative Example 3.

As shown in FIG. 3, the electron-donating polymer according to Example 3 absorbs light in a wide wavelength region ranging from about 300 nm to about 900 nm.

On the contrary, as shown in FIG. 4, the electron-donating polymer according to Comparative Example 3 absorbs light in a narrower wavelength region, primarily ranging from about 600 nm to about 750 nm.

Resultantly, the electron-donating polymers according to Examples 1 to 3 has small band gaps and good light absorption characteristics.

While this disclosure has described some example embodiments, it is to be understood by one of ordinary skill in the art that various modifications and equivalent arrangements may be made therein without departing from the spirit and scope of the claims.

What is claimed is:
1. An electron-donating polymer comprising:
at least one repeating unit A represented by one of the following Chemical Formula 1, Chemical Formula 2, and a combination thereof; and
at least one repeating unit B represented by Chemical Formula 3:

[Chemical Formula 1]

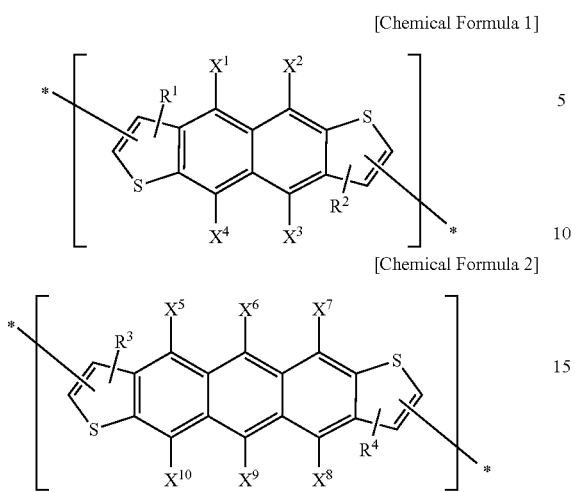

[Chemical Formula 2]

wherein, in the above Chemical Formulae 1 and 2,
$X^1$ to $X^{10}$ are the same or different, and $X^1$ to $X^{10}$ are each independently one of hydrogen, a halogen, a substituted or unsubstituted C1 to C20 aliphatic organic group, a hydroxy group, a substituted or unsubstituted C1 to C20 alkoxy group, a substituted or unsubstituted C1 to C20 ester group, a thiol group, and —$SR^{100}$,
wherein $R^{100}$ is one of a substituted or unsubstituted C1 to C20 aliphatic organic group, a substituted or unsubstituted C2 to C30 aromatic organic group, and a substituted or unsubstituted C2 to C30 heterocycloalkyl group, and
$R^1$ to $R^4$ are the same or different, and $R^1$ to $R^4$ are each independently one of hydrogen, a substituted or unsubstituted C1 to C20 linear or branched alkyl group, a substituted or unsubstituted C3 to C20 cycloalkyl group, a substituted or unsubstituted C1 to C20 alkoxy group, a substituted or unsubstituted C6 to C30 aryl group, a substituted or unsubstituted C2 to C30 heteroaryl group, and a combination thereof,

[Chemical Formula 3]

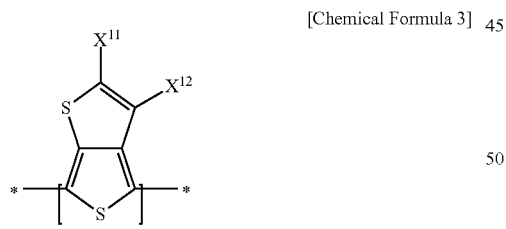

wherein, in Chemical Formula 3,
$X^{11}$ and $X^{12}$ are the same or different, and are each independently one of hydrogen, halogen, a substituted or unsubstituted C1 to C20 aliphatic organic group, a hydroxy group, a substituted or unsubstituted C1 to C20 alkoxy group, a substituted or unsubstituted C1 to C20 ester group, a thiol group, or —$SR^{103}$, wherein $R^{103}$ is a substituted or unsubstituted C1 to C20 aliphatic organic group, a substituted or unsubstituted C2 to C30 aromatic organic group, and a substituted or unsubstituted C2 to C30 heterocycloalkyl group, and
in Chemical Formula 3, $X^{11}$ and $X^{12}$ are not a C1 to C20 alkyl group substituted with a halogen.

2. An electron-donating polymer comprising:
at least one repeating unit A represented by one of the following Chemical Formula 1, Chemical Formula 2, and a combination thereof; and
at least one repeating unit B represented by Chemical Formula 3:

[Chemical Formula 1]

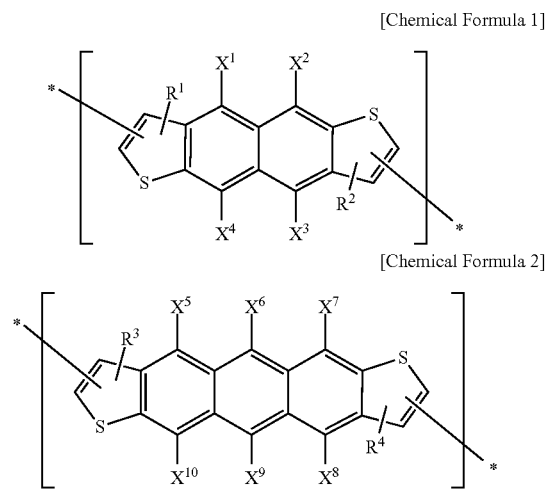

[Chemical Formula 2]

wherein, in the above Chemical Formulae 1 and 2,
$X^1$ to $X^{10}$ are the same or different, and $X^1$ to $X^{10}$ are each independently one of hydrogen, a halogen, a substituted or unsubstituted C1 to C20 aliphatic organic group, a hydroxy group, a substituted or unsubstituted C1 to C20 alkoxy group, a substituted or unsubstituted C1 to C20 ester group, a thiol group, and —$SR^{100}$,
wherein $R^{100}$ is one of a substituted or unsubstituted C1 to C20 aliphatic organic group, a substituted or unsubstituted C2 to C30 aromatic organic group, and a substituted or unsubstituted C2 to C30 heterocycloalkyl group, and
$R^1$ to $R^4$ are the same or different, and $R^1$ to $R^4$ are each independently one of hydrogen, a substituted or unsubstituted C1 to C20 linear or branched alkyl group, a substituted or unsubstituted C3 to C20 cycloalkyl group, a substituted or unsubstituted C1 to C20 alkoxy group, a substituted or unsubstituted C6 to C30 aryl group, a substituted or unsubstituted C2 to C30 heteroaryl group, and a combination thereof,

[Chemical Formula 3]

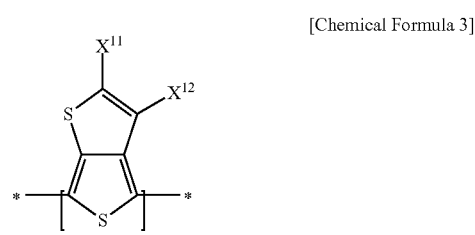

wherein, in Chemical Formula 3,
$X^{11}$ $X^{12}$ are the same or different, and are each independently one of hydrogen, halogen, a substituted or unsubstituted C1 to C20 aliphatic organic group, a hydroxy group, a substituted or unsubstituted C1 to C20 alkoxy group, a substituted or unsubstituted C1 to C20 ester group, a thiol group, or —$SR^{103}$, wherein $R^{103}$ is a substituted or unsubstituted C1 to C20 aliphatic organic group, a substituted or unsubstituted C2 to C30 aromatic organic group, and a substituted or unsubstituted C2 to C30 heterocycloalkyl group, wherein the repeating unit A includes at least one repeating unit represented by one of the following Chemical Formulae 4 to 9 and a combination thereof:

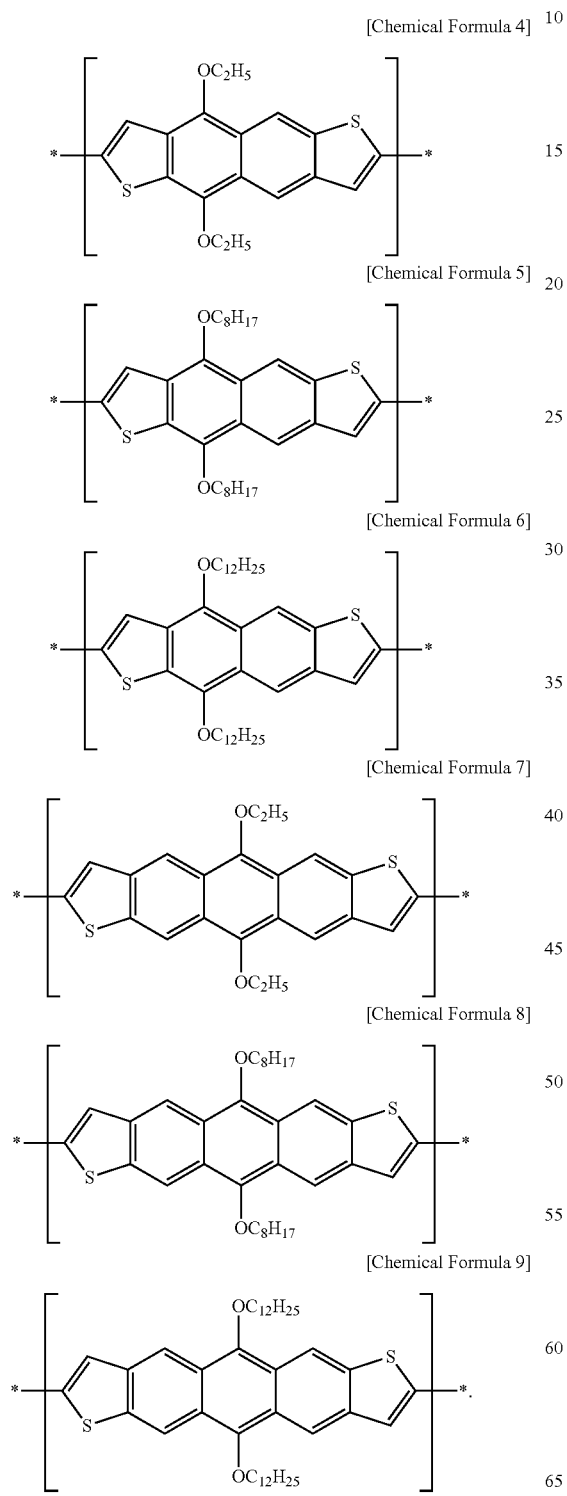

3. The electron-donating polymer of claim 1, wherein the electron-donating polymer includes the repeating units A and B in a mole ratio ranging from about 1:1 to about 1:1.4.

4. An electron-donating polymer comprising:
at least one repeating unit A represented by one of the following Chemical Formula 1, Chemical Formula 2, and a combination thereof;
at least one repeating unit B represented by Chemical Formula 3; and
at least one repeating unit represented by one of the following Chemical Formulae 16 to 33 and a combination thereof:

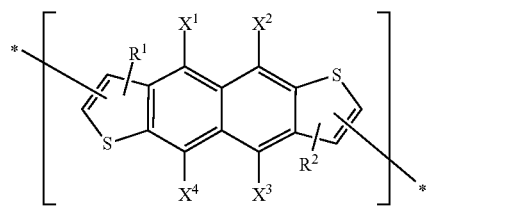

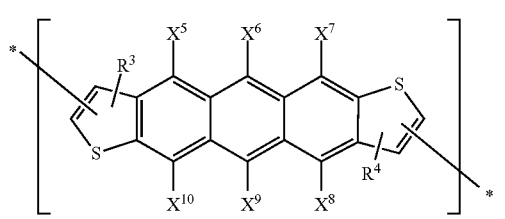

wherein, in the above Chemical Formulae 1 and 2,
$X^1$ to $X^{10}$ are the same or different, and $X^1$ to $X^{10}$ are each independently one of hydrogen, a halogen, a substituted or unsubstituted C1 to C20 aliphatic organic group, a hydroxy group, a substituted or unsubstituted C1 to C20 alkoxy group, a substituted or unsubstituted C1 to C20 ester group, a thiol group, and —$SR^{100}$,
wherein $R^{100}$ is one of a substituted or unsubstituted C1 to C20 aliphatic organic group, a substituted or unsubstituted C2 to C30 aromatic organic group, and a substituted or unsubstituted C2 to C30 heterocycloalkyl group, and
$R^1$ to $R^4$ are the same or different, and $R^1$ to $R^4$ are each independently one of hydrogen, a substituted or unsubstituted C1 to C20 linear or branched alkyl group, a substituted or unsubstituted C3 to C20 cycloalkyl group, a substituted or unsubstituted C1 to C20 alkoxy group, a substituted or unsubstituted C6 to C30 aryl group, a substituted or unsubstituted C2 to C30 heteroaryl group, and a combination thereof,

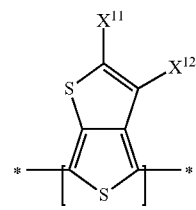

wherein, in Chemical Formula 3, $X^{11}$ and $X^{12}$ are the same or different, and are each independently one of hydrogen, halogen, a substituted or unsubstituted C1 to C20 aliphatic organic group, a hydroxy group, a substituted or unsubstituted C1 to C20 alkoxy group, a substituted or unsubstituted C1 to C20 ester group, a thiol group, or —$SR^{103}$, wherein $R^{103}$ is a substituted or unsubstituted C1 to C20 aliphatic organic group, a substituted or unsubstituted C2 to C30 aromatic organic group, and a substituted or unsubstituted C2 to C30 heterocycloalkyl group,

[Chemical Formula 16]

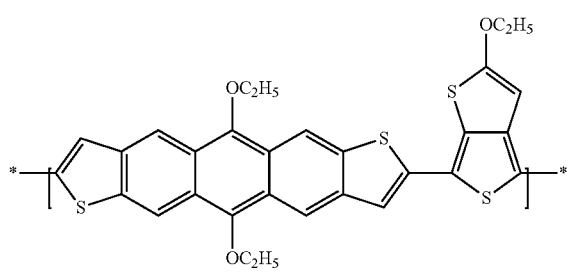

[Chemical Formula 17]

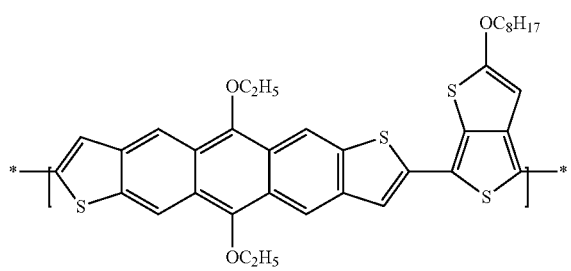

[Chemical Formula 18]

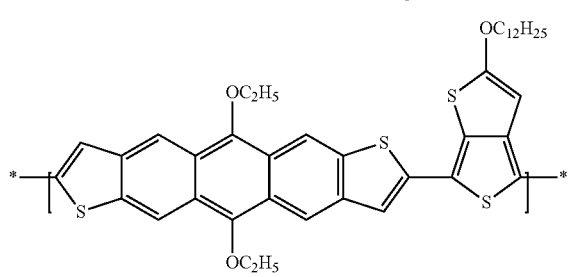

[Chemical Formula 19]

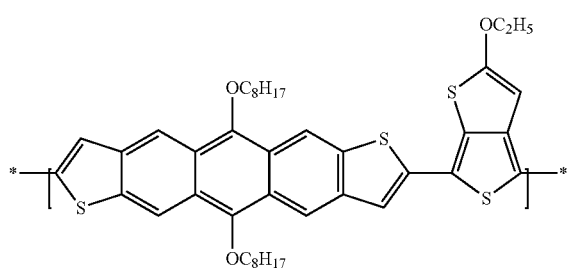

[Chemical Formula 20]

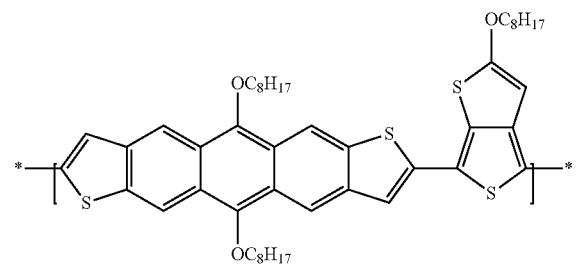

[Chemical Formula 21]

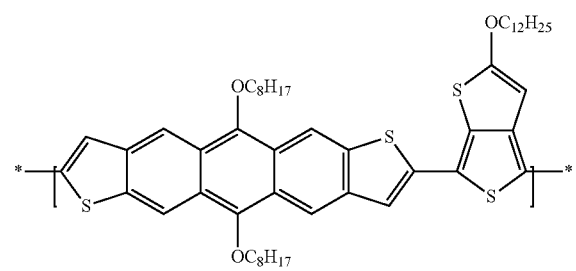

[Chemical Formula 22]

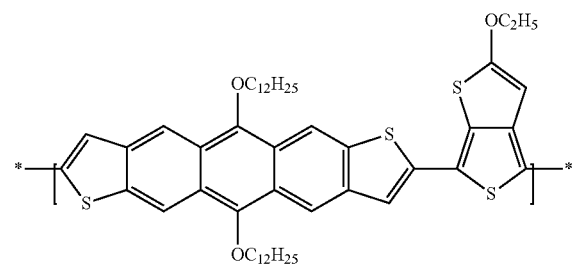

[Chemical Formula 23]

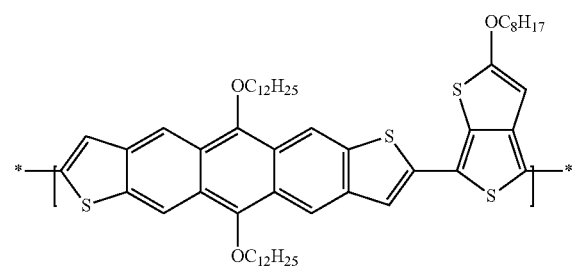

[Chemical Formula 24]

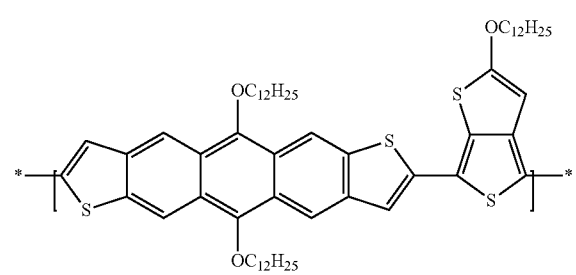

[Chemical Formula 25]
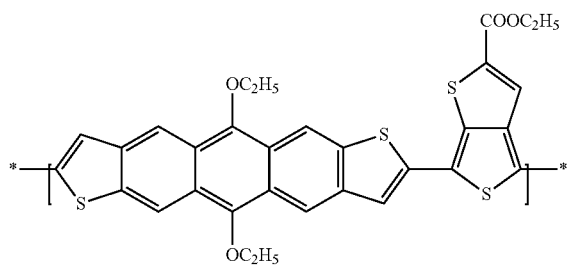

[Chemical Formula 26]
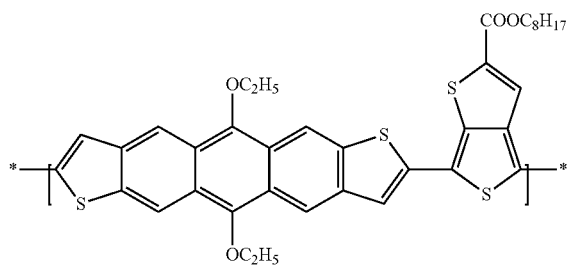

[Chemical Formula 27]
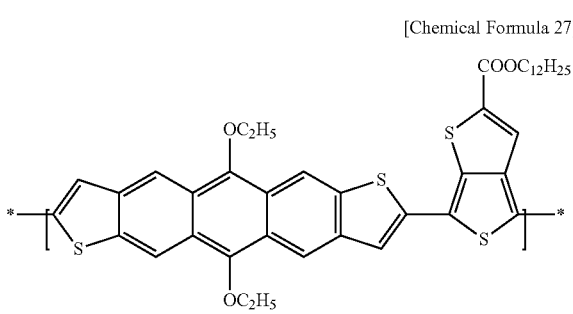

[Chemical Formula 28]
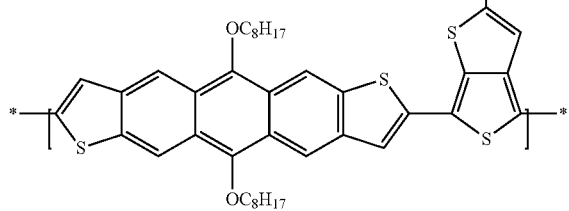

[Chemical Formula 29]
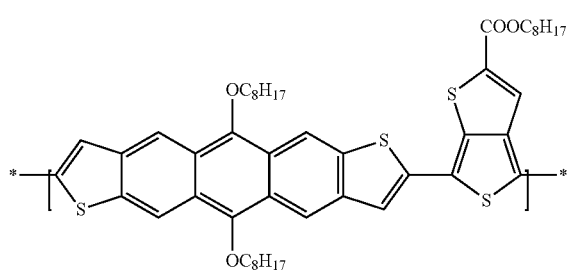

[Chemical Formula 30]
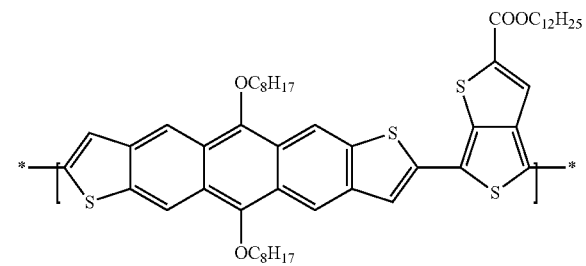

[Chemical Formula 31]
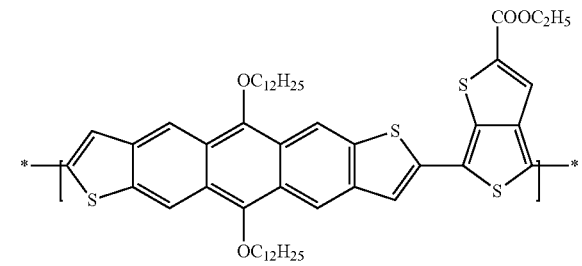

[Chemical Formula 32]
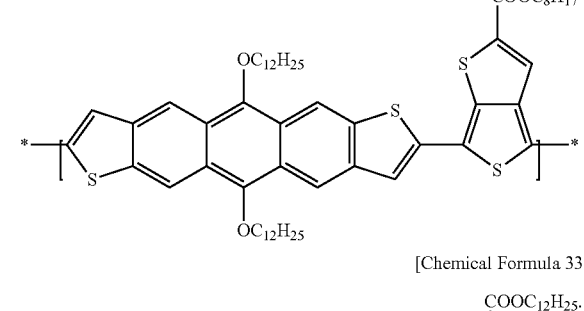

[Chemical Formula 33]
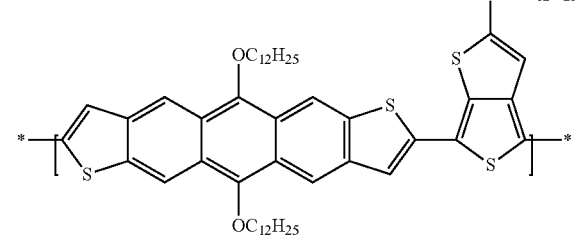

5. The electron-donating polymer of claim 4, wherein the electron-donating polymer includes at least one repeating unit represented by one of the following Chemical Formulae 16, 20, 30, and a combination thereof:

[Chemical Formula 16]
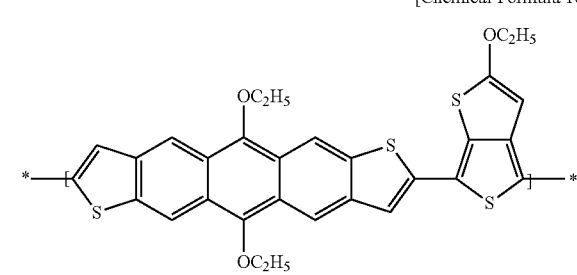

-continued

[Chemical Formula 20]

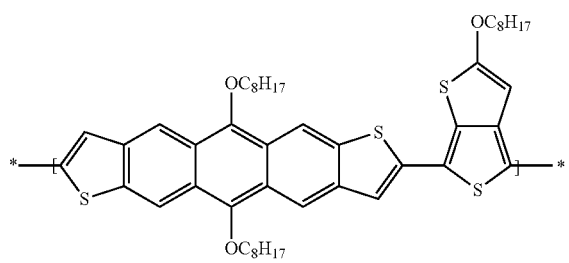

[Chemical Formula 30]

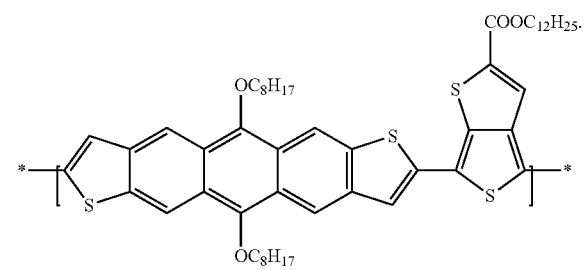

[Chemical Formula 30]

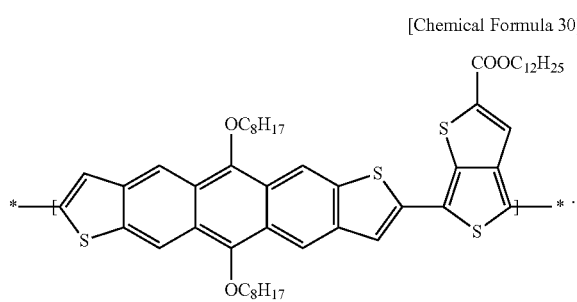

6. The electron-donating polymer of claim 5, wherein the electron-donating polymer includes at least one repeating unit represented by the following Chemical Formula 16:

[Chemical Formula 16]

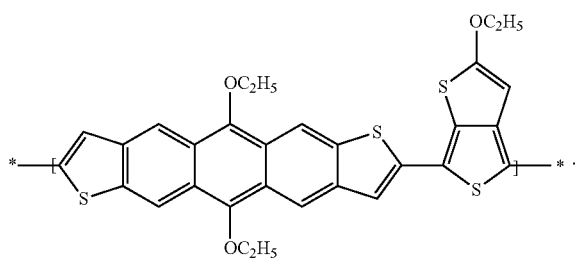

7. The electron-donating polymer of claim 5, wherein the electron-donating polymer includes at least one repeating unit represented by the following Chemical Formula 20:

[Chemical Formula 20]

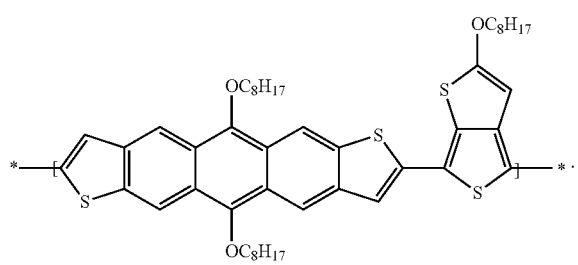

8. The electron-donating polymer of claim 5, wherein the electron-donating polymer includes at least one repeating unit represented by the following Chemical Formula 30:

9. The electron-donating polymer of claim 1, which has a number average molecular weight ranging from about 1000 to about 800,000.

10. The electron-donating polymer of claim 1, which has a band gap ranging from about 1.2 eV to about 2.5 eV.

11. The electron-donating polymer of claim 1, wherein in the at least one repeating unit A,
one $CH_2$ group included in $R^1$ to $R^4$ or at least two non-adjacent $CH_2$ groups included in $R^1$ to $R^4$ are substituted with one of —O—, —S—, —$SO_2$—, —CO—, —OCO—, —COO—, —C═C—, —C≡C—, and —$SiR^{101}R^{102}$,
wherein $R^{101}$ and $R^{102}$ are the same or different and each independently are one of hydrogen, a substituted or unsubstituted C1 to C20 linear or branched alkyl group, a substituted or unsubstituted C3 to C20 cycloalkyl group, a substituted or unsubstituted C1 to C20 alkoxy group, a substituted or unsubstituted C6 to C30 aryl group, a substituted or unsubstituted C2 to C30 heteroaryl group, and a combination thereof.

12. The electron-donating polymer of claim 1, wherein at least one repeating unit B of the electron-donating polymer includes one of the following Chemical Formulae 10 to 15 and a combination thereof:

[Chemical Formula 10]

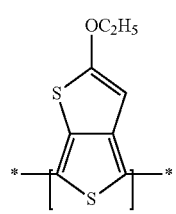

[Chemical Formula 11]

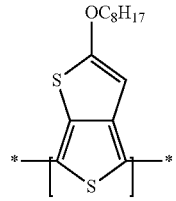

[Chemical Formula 12]

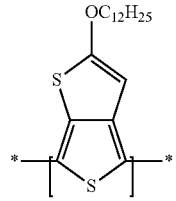

-continued

[Chemical Formula 13]

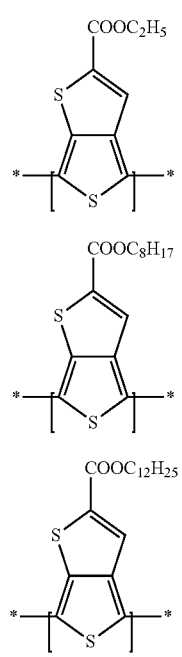

[Chemical Formula 14]

[Chemical Formula 15]

and the electron-donating polymer includes the repeating units A and B in a mole ratio ranging from about 1:1.001 to about 1:1.2.

13. The electron-donating polymer of claim 2, wherein at least one repeating unit A of the electron-donating polymer includes one of following Chemical Formulae 4 to 6 and a combination thereof:

[Chemical Formula 4]

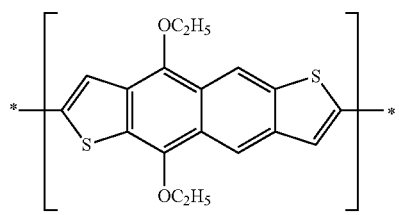

[Chemical Formula 5]

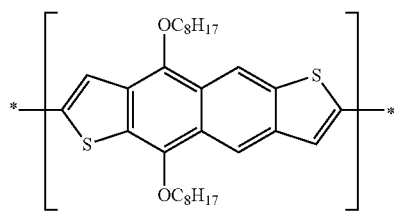

[Chemical Formula 6]

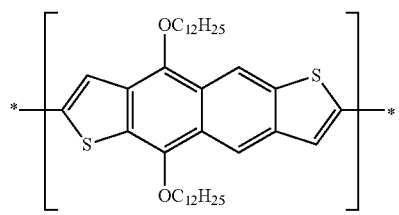

14. The electron-donating polymer of claim 2, wherein at least one repeating unit A of the electron-donating polymer includes one of following Chemical Formulae 7 to 9 and a combination thereof:

[Chemical Formula 7]

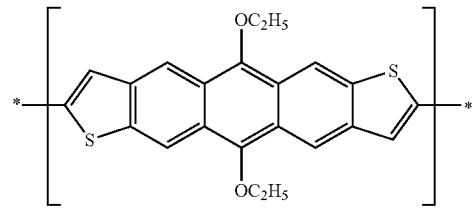

[Chemical Formula 8]

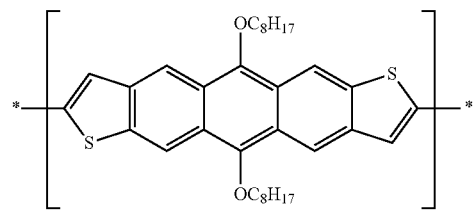

[Chemical Formula 9]

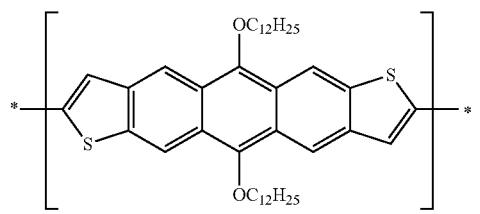

15. A photoactive layer comprising the electron-donating polymer according to claim 1.

16. An electronic device comprising the photoactive layer according to claim 15.

17. An organic solar cell comprising:
   a substrate,
   an anode and a cathode facing each other and on the substrate; and
   a photoactive layer disposed between the anode and the cathode and comprising an electron donor and an electron acceptor,
   wherein the electron donor comprises the electron-donating polymer according to claim 1.

18. An organic solar cell comprising,
   a substrate,
   an anode and a cathode facing each other and on the substrate; and
   a photoactive layer disposed between the anode and the cathode and comprising an electron donor and an electron acceptor,
   wherein the electron donor includes the electron-donating polymer according to claim 4.

19. The organic solar cell of claim 17, wherein
   the substrate comprises one of glass, polycarbonate, polymethylmethacrylate, polyethylene terephthalate, polyethylene naphthalate, polyamide, and polyethersulfone;
   one of the anode and the cathode comprises one of indium tin oxide (ITO), indium-doped zinc oxide (IZO), tin oxide (SnO2), aluminum-doped zinc oxide (AZO), gallium-doped zinc oxide (GZO), and combinations thereof;

the other of the anode and the cathode comprises one of aluminum (Al), silver (Ag), gold (Au), lithium (Li), and combinations thereof, the photoactive layer includes an electron acceptor material, and the electron acceptor material comprises one of C60, C70, C74, C76, C78, C82, C84, C720, C860, C61-PCBM, C71—PCBM, C84—PCBM, bis-PCBM, perylene; CdS, CdTe, CdSe, ZnO, and combinations thereof.

20. The electron-donating polymer of claim 1, wherein, the electron-donating polymer includes one of the repeating unit A represented by the Chemical Formula 2 that is directly connected to one of the repeating unit B represented by the Chemical Formula 3.

* * * * *